(12) United States Patent
Liang et al.

(10) Patent No.: US 12,405,503 B2
(45) Date of Patent: Sep. 2, 2025

(54) SIGNAL SELECTOR AND DRIVING METHOD THEREFOR, DISPLAY PANEL, AND DISPLAY APPARATUS

(71) Applicants: Ordos Yuansheng Optoelectronics Co., Ltd., Inner Mongolia (CN); BOE Technology Group Co. Ltd., Beijing (CN)

(72) Inventors: Chao Liang, Beijing (CN); Jingyi Xu, Beijing (CN); Peirong Huo, Beijing (CN); Zhiming Li, Beijing (CN); Bo Huang, Beijing (CN); Shuai Han, Beijing (CN); Guodong Wang, Beijing (CN); Jiantao Liu, Beijing (CN); Biqi Li, Beijing (CN); Jianyun Xie, Beijing (CN)

(73) Assignees: ORDOS YUANSHENG OPTOELECTRONICS CO., LTD., Inner Mongolia (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/690,293

(22) PCT Filed: Jun. 29, 2022

(86) PCT No.: PCT/CN2022/102368
§ 371 (c)(1),
(2) Date: Mar. 8, 2024

(87) PCT Pub. No.: WO2024/000271
PCT Pub. Date: Jan. 4, 2024

(65) Prior Publication Data
US 2024/0255819 A1    Aug. 1, 2024

(51) Int. Cl.
*G02F 1/1362* (2006.01)
*G02F 1/1333* (2006.01)
(Continued)

(52) U.S. Cl.
CPC .... *G02F 1/136286* (2013.01); *G02F 1/13338* (2013.01); *G02F 1/1368* (2013.01);
(Continued)

(58) Field of Classification Search
CPC ........... G02F 1/136286; G02F 1/13338; G02F 1/1368; G06F 3/0412; G06F 3/04164;
(Continued)

(56) References Cited

U.S. PATENT DOCUMENTS

2021/0241709 A1*  8/2021  Takeuchi ............ G09G 3/3677
2022/0208129 A1*  6/2022  Yoo ...................... G09G 3/3258

FOREIGN PATENT DOCUMENTS

CN    102737581 A    10/2012
CN    103208263 A    7/2013
(Continued)

OTHER PUBLICATIONS

International Search Report of PCT application No. PCT/CN2022/102368 dated Jan. 4, 2023.
(Continued)

*Primary Examiner* — Adam R. Giesy
(74) *Attorney, Agent, or Firm* — Calfee, Halter & Griswold LLP

(57) ABSTRACT

The present disclosure relates to a signal selector and a driving method therefor, a display panel, and a display device. The signal selector loads a writing signal into a control end of a switching circuit during a data writing time period, and the switching circuit is connected in response to the writing signal loaded on the control end of the switching circuit, so that the writing signal is loaded to a far end of an
(Continued)

---

In a preparation period, loading a preparation voltage to a gate of a boost transistor to make a Vgs of the boost transistor not less than a Vth of the boost transistor — S10

In a data write period after the preparation period, loading a write signal to a control terminal of a switch circuit — S20

In a pull-up period after the data write period, loading a boost control signal to a control terminal of the boost transistor — S30 output signal line. During a pull up period after the data writing period, a boost control signal is loaded to the control end of a boost circuit, and the boost circuit pulls up the voltage of an output end of the switching circuit in response to the boost control signal loaded on a second end of the boost circuit.

19 Claims, 13 Drawing Sheets

(51) Int. Cl.
    *G02F 1/1368* (2006.01)
    *G06F 3/041* (2006.01)
    *G09G 3/20* (2006.01)
    *G09G 3/36* (2006.01)
    *H10D 86/40* (2025.01)
    *H10D 86/60* (2025.01)

(52) U.S. Cl.
    CPC ........ *G06F 3/0412* (2013.01); *G06F 3/04164* (2019.05); *G09G 3/2074* (2013.01); *G09G 3/3607* (2013.01); *H10D 86/441* (2025.01); *H10D 86/60* (2025.01); *G09G 2300/0408* (2013.01); *G09G 2300/0814* (2013.01); *G09G 2300/0819* (2013.01); *G09G 2300/0852* (2013.01); *G09G 2310/0297* (2013.01); *G09G 2310/06* (2013.01); *G09G 2354/00* (2013.01)

(58) Field of Classification Search
    CPC ............... G09G 3/2074; G09G 3/3607; G09G 2300/0408; G09G 2300/0814; G09G 2300/0819; G09G 2300/0852; G09G 2310/0297; G09G 2310/06; G09G 2354/00; G09G 3/3233; G09G 3/36; H10D 86/441; H10D 86/60; H01L 27/124; H03K 17/62
    See application file for complete search history.

(56) References Cited

FOREIGN PATENT DOCUMENTS

| | | |
|---|---|---|
| CN | 108352835 A | 7/2018 |
| CN | 110136668 A | 8/2019 |
| CN | 112712778 A | 4/2021 |
| JP | H05232508 A | 9/1993 |
| TW | 373178 B | 11/1999 |
| TW | 202020850 A | 6/2020 |

OTHER PUBLICATIONS

Written opinion of PCT application No. PCT/CN2022/102368 dated Jan. 4, 2023.

* cited by examiner

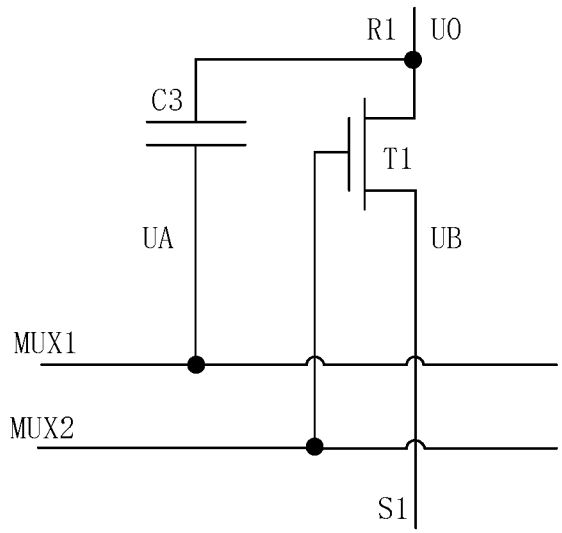

FIG. 7

| In a preparation period, loading a preparation voltage to a gate of a boost transistor to make a Vgs of the boost transistor not less than a Vth of the boost transistor | S10 |

| In a data write period after the preparation period, loading a write signal to a control terminal of a switch circuit | S20 |

| In a pull-up period after the data write period, loading a boost control signal to a control terminal of the boost transistor | S30 |

FIG. 8

SIGNAL SELECTOR AND DRIVING METHOD THEREFOR, DISPLAY PANEL, AND DISPLAY APPARATUS

CROSS-REFERENCE

The present application is a U.S. National Stage of International Application No. PCT/CN2022/102368, filed on Jun. 29, 2022, the contents of which are incorporated herein by reference in their entireties for all purposes.

TECHNICAL FIELD

The present disclosure relates to the field of display technologies, and in particular, to a signal selector and a driving method therefor, a display panel, and a display device.

BACKGROUND

At present, large-sized and high-resolution display panels have gradually become a development trend.

It should be noted that the information disclosed in the Background section above is only for enhancing the understanding of the background of the present disclosure, and thus may include information that does not constitute prior art known to those of ordinary skill in the art.

SUMMARY

The present disclosure provides a signal selector and a driving method therefor, a display panel, and a display device.

According to an aspect of the present disclosure, there is provided a signal selector configured to distribute a signal on an input data line to different output data lines. The output data line is configured to drive a sub-pixel of a display panel. The signal selector includes a plurality of switch units. Any switch unit includes a switch circuit and a boost circuit. The switch circuit is coupled to the input data line and one output data line, and is configured to conduct in response to a write signal loaded on a control terminal of the switch circuit. A first terminal of the boost circuit is electrically coupled to an output terminal of the switch circuit, and the boost circuit is configured to pull up a voltage of the output terminal of the switch circuit in response to a boost control signal loaded on a control terminal of the boost circuit.

According to another aspect of the present disclosure, there is provided a display panel, including the signal selector of any of the above embodiments.

According to yet another aspect of the present disclosure, there is provided a display panel, including a base substrate and a driving circuit layer disposed on a side of the base substrate. The driving circuit layer includes a plurality of switch circuit areas, and the switch circuit area includes an active layer, a gate layer and a source-drain metal layer. The active layer is disposed on the side of the base substrate, and includes a first active part, a second active part, a third active part, a fourth active part and a fifth active part. The gate layer is disposed on a side of the active layer away from the base substrate, and includes a first control lead, a second control lead and a first input data line arranged along a first direction. An orthographic projection of the first control lead on the base substrate is overlapped with an orthographic projection of the first active part on the base substrate, and an orthographic projection of the second control lead on the base substrate is overlapped with an orthographic projection of the second active part on the base substrate. The source-drain metal layer is disposed on a side of the gate layer away from the base substrate, and includes a first signal line and a second signal line arranged along a second direction, and a first conductive structure, a second conductive structure, a third conductive structure and an output data line arranged along the first direction. The second signal line is coupled to the first control lead, and the first signal line is coupled to the second control lead. The first conductive structure is coupled to the first input data line. An orthographic projection of the first conductive structure on the base substrate is overlapped with an orthographic projection of the third active part on the base substrate, and the first conductive structure is coupled to the third active part. An orthographic projection of the second conductive structure on the base substrate is overlapped with an orthographic projection of the fourth active part on the base substrate, and the second conductive structure is coupled to the fourth active part. An orthographic projection of the third conductive structure on the base substrate is overlapped with an orthographic projection of the five active part on the base substrate, and the third conductive structure is coupled to the five active part. The third conductive structure is coupled to the second conductive structure, and the second conductive structure and the third conductive structure are coupled to the output data line.

According to still another aspect of the present disclosure, there is provided a display device, including the display panel according to any one of the above embodiments.

According to still another aspect of the present disclosure, there is provided a display panel, including a base substrate and a driving circuit layer disposed on a side of the base substrate. The driving circuit layer includes a plurality of switch circuit areas, and the switch circuit area includes an active layer, a gate layer and a source-drain metal layer. The active layer is located on the side of the base substrate, and includes a first active part, a third active part and a fourth active part. The gate layer is located on a side of the active layer away from the base substrate, and includes a first control lead, a second control lead and a first input data line. An orthogonal projection of the first control lead on the base substrate is overlapped with an orthogonal projection of the first active part on the base substrate. The source-drain metal layer is disposed on a side of the gate layer away from the base substrate, and includes a first signal line and a second signal line arranged along a second direction, and a first conductive structure, a second conductive structure, a third conductive structure and an output data line arranged along a first direction. The second signal line is coupled to the first control lead, and the first signal line is coupled to the second control lead. The first conductive structure is coupled to the first input data line, an orthographic projection of the first conductive structure on the base substrate is overlapped with an orthographic projection of the third active part on the base substrate, and the first conductive structure is coupled to the third active part. An orthographic projection of the second conductive structure on the base substrate is overlapped with an orthographic projection of the fourth active part on the base substrate, and the second conductive structure is coupled to the fourth active part. An orthographic projection of the third conductive structure on the base substrate is overlapped with an orthographic projection of the second control lead on the base substrate. A storage capacitor is formed by the third conductive structure and the second control lead, the third conductive structure is coupled to the second conductive structure, and the second conductive structure and the third conductive structure are coupled to the output data line.

According to still another aspect of the present disclosure, there is provided a driving method for a signal selector, including:

loading a write signal to a control terminal of a switch circuit in a data write period; and loading a boost control signal to a control terminal of the boost circuit in a pull-up period after the data write period.

It should be noted that the above general description and the following detailed description are merely exemplary and explanatory and should not be construed as limiting of the disclosure.

BRIEF DESCRIPTION OF THE DRAWINGS

The drawings here are incorporated into the specification and constitute a part of the specification, show embodiments in consistent with the present disclosure, and are used together with the specification to explain principles of the present disclosure. Obviously, the drawings in the following description are only some embodiments of the present disclosure. For those of ordinary skill in the art, other drawings can be obtained based on these drawings without creative work.

FIG. 7 is a circuit connection diagram of a first red sub-pixel R1 of another signal selector in a case that a boost circuit is a boost capacitor according to an embodiment of the present disclosure.

FIG. 8 is a flowchart of a driving method for a signal selector according to an embodiment of the present disclosure.

DETAILED DESCRIPTION

Figure 1:
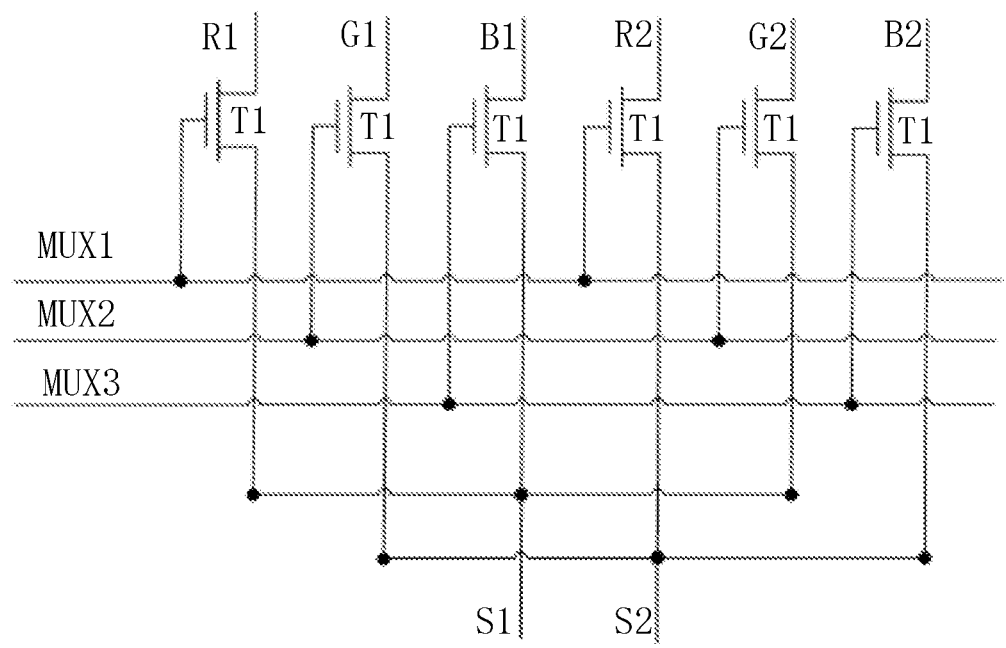
FIG. 1 is a circuit connection diagram of a signal selector according to an embodiment of the present disclosure.

Example embodiments will now be described more fully with reference to the accompanying drawings. However, the example embodiments can be implemented in a variety of forms and should not be construed as being limited to implementations set forth herein; rather, these embodiments are provided so that the present disclosure will be thorough and complete so as to convey the idea of the example embodiments to those skilled in this art. The same reference numerals in the drawings denote the same or similar structures, and the detailed description thereof will be omitted. In addition, the drawings are merely schematic representations of the present disclosure and are not necessarily drawn to scale.

Although the relative terms such as "above" and "below" are used in the specification to describe the relative relationship of one component to another component shown, these terms are only for convenience in this specification, for example, according to an example direction shown in the drawings. It will be understood that if the device shown is flipped upside down, the component described as "above" will become a component "below" another component. When a structure is "on" another structure, it may mean that a structure is integrally formed on another structure, or that a structure is "directly" disposed on another structure, or that a structure is "indirectly" disposed on another structure through other structures.

The terms "one", "a", "the", "said", and "at least one" are used to indicate that there are one or more elements/components or the like; the terms "include" and "have" are used to indicate an open meaning of including and means that there may be additional elements/components/etc. in addition to the listed elements/components/etc.; and the terms "first", "second" and "third" etc. are used only as markers, and do not limit the number of objects.

A signal selector (such as a multiplexer (MUX)) may control the on or off of a MOS transistor through a level change of a gate control signal in different periods, so that a driving signal of a driving chip (such as an integrated circuit (IC)) can be input to a display area, thereby controlling brightness and darkness of sub-pixels of different colors.

As shown in FIG. 1, a ⅔ signal selector (such as the MUX) is taken as an example. One of a source and a drain of the existing switch transistor T1 is electrically coupled to a first sub-input data line S1 or a second sub-input data line S2. A first input data line is electrically coupled to a pin terminal of a driving chip. The other one of the source and the drain of the switch transistor T1 is electrically coupled to a sub-pixel with a different color (e.g., a first red sub-pixel R1, a first green sub-pixel G1 and a first blue sub-pixel B1) in a display area through an output data line. A gate of the switch transistor T1 is controlled by the corresponding first signal line.

The first input data line includes a first sub-input data line S1 and a second sub-input data line S2. The first sub-input data line S1 can provide the first red sub-pixel R1, a second green sub-pixel G2, and the first blue sub-pixel B1 in the display area with a signal, and the second sub-input data line S2 can provide a second red sub-pixel R2, the first green sub-pixel G1 and a second blue sub-pixel B2 in the display area with the signal. Gates of different switch transistors T1 corresponding to the sub-pixels of different colors are controlled by corresponding first signal lines. Specifically, the first red sub-pixel R1 is controlled by a first sub-signal line MUX1, the second green sub-pixel G2 is controlled by a second sub-signal line MUX2, and the first blue sub-pixel B1 is controlled by a third sub-signal line MUX3.

Figure 2:
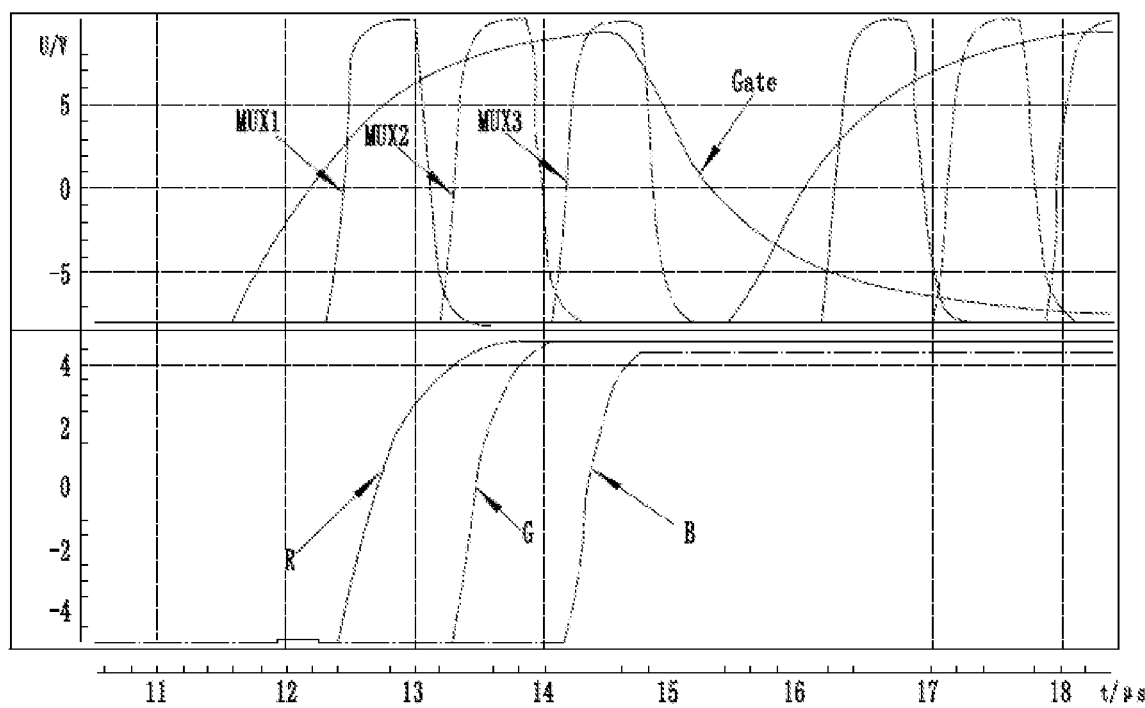
FIG. 2 is a simulation waveform diagram of a first red sub-pixel R1, a second green sub-pixel G2, and a first blue sub-pixel B1 of a signal selector according to an embodiment of the present disclosure.

FIG. 2 is a simulation waveform diagram of the first red sub-pixel R1, the second green sub-pixel G2, and the second blue sub-pixel B1, where output data lines of sub-pixels of different colors are coupled to gates of driving transistors, and when a gate signal Gate of a driving transistor of a sub-pixel of a certain color is overlapped with a data signal output under the control of a first signal line, the sub-pixel is lit. Specifically, when a gate signal Gate of a driving transistor of the red sub-pixel R1 is overlapped with a data signal output under the control of the first sub-signal line MUX1, the red sub-pixel R1 is lit, and the second green sub-pixel G2 and the blue sub-pixel R1 are illuminated in a similar manner, which will not be described in details here. It can be understood that the signal selector only plays the role of circuit selection in the display.

If an operation time of the signal selector is sufficient or an internal resistance voltage drop (such as the RC Loading) is small, a final voltage at a distal end of the output data line can be charged to the same voltage as the first input data line. However, for medium-to-large sized, high resolution and high refresh rate display panels, the operation time of the signal selector is greatly reduced, and in addition, the internal resistance voltage drop of the output data line increases, causing the final voltage at the distal end of the output data line to be lower than the voltage on the first input data line, which will cause the occurrence of a defect such as a vertical stripe, a horizontal stripe, and screen splitting on the display panel.

Taking a display panel with a size of 17D6, a resolution of 1600×2560, and a MUX3 as an example, the role of the signal selector in a charging process of the display panel is further explained. Due to the high resolution and the large size of the 17D6 display panel, it is difficult to meet a charging specification requirement of the display panel using the existing signal selector.

Figure 3:
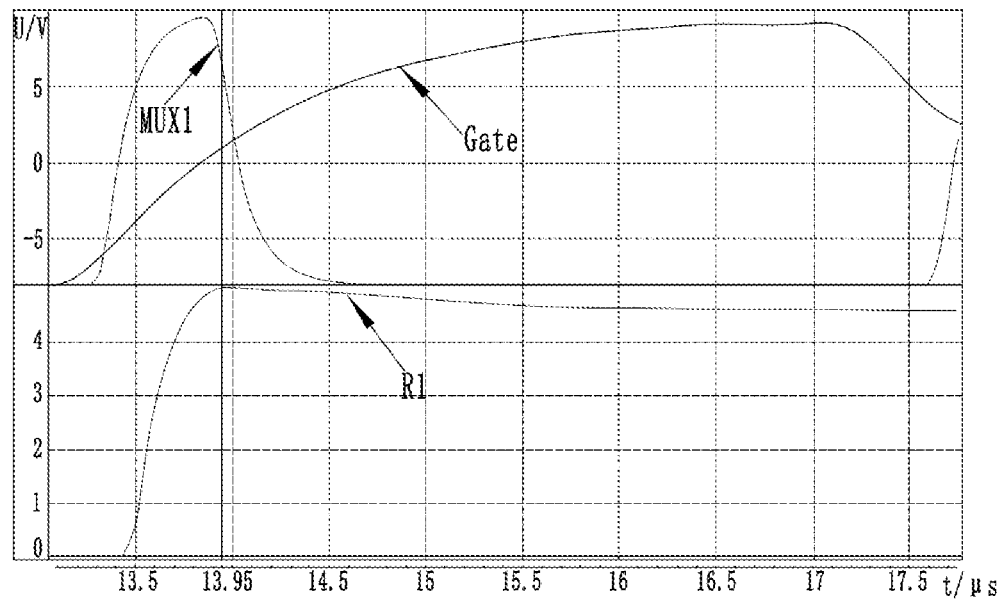
FIG. 3 is a simulation diagram of a charging process of a signal selector according to an embodiment of the present disclosure.

The red sub-pixel R1 is taken as an example for explanation. A charging simulation of the display panel using the above signal selector is shown in FIG. 3. A driving voltage provided by the first sub-signal line MUX1 is 5.3V, the maximum voltage that can be charged on the output data line of the first red sub-pixel R1 is 4.984V, and a charging ratio of the display panel is 4.984/5.3=0.94, which is smaller than a charging ratio specification of 0.99 required by the display panel, and as a result, the display panel will be subject to the display defect such as the horizontal stripe, the vertical stripe or the like.

Based on this, the present disclosure provides a signal selector, which may be a multiplexer (MUX). As shown in FIGS. 4 to 7, the signal selector is configured to distribute a signal on a first input data line to different output data lines, and the output data line is configured to drive a sub-pixel of a display panel. The signal selector includes a plurality of switch units, and any switch unit includes a switch circuit and a boost circuit. The switch circuit is coupled to the first input data line and one output data line, and is configured to conduct in response to a write signal loaded on a control terminal of the switch circuit. A first terminal of the boost circuit is electrically coupled to an output terminal of the switch circuit, and the boost circuit is configured to pull up a voltage of the output terminal of the switch circuit in response to a boost control signal loaded on a control terminal of the boost circuit.

The signal selector loads the write signal to the control terminal of the switch circuit in a data write period, and the switch circuit turns on in response to the write signal loaded on its control terminal, so that the write signal is loaded to a distal end of the output signal line. In a pull-up period after the data write period, the boost control signal is loaded to the control terminal of the boost circuit, and the boost circuit pulls up a voltage of the output terminal of the switch circuit in response to the boost control signal loaded on its control terminal. Therefore, the signal selector of the present disclosure can realize the rapid rise and fall of the voltage at the distal end of the output data line, thereby achieving the charging specification of the medium-to-large sized and high resolution display panel.

It should be noted that each switch unit may further include a first signal line and a second signal line. The first signal line is electrically coupled to the control terminal of the boost circuit and is configured to load the boost control signal to the boost circuit. The second signal line is electrically coupled to the control terminal of the switch circuit and is configured to load the write signal to the switch circuit.

The signal selector may include N first input data lines, one first input data line is coupled to one switch unit group, each switch unit group includes M switch units, and N switch unit groups include a total of M×N switch units.

The M switch units include M switch circuits, the M switch circuits are coupled to M output data lines, and the M output data lines are respectively coupled to sub-pixels of M different colors. It should be noted that M is greater than or equal to 3.

Control terminals of boost circuits of the sub-pixels of M colors are loaded with M different boost signals, and thus M first signal lines are typically provided. Control terminals of switch circuits of the sub-pixels of M colors are loaded with M different write signals, and thus M second signal lines are typically provided. Therefore, the number of signal lines is typically set to 2M.

Figure 4:
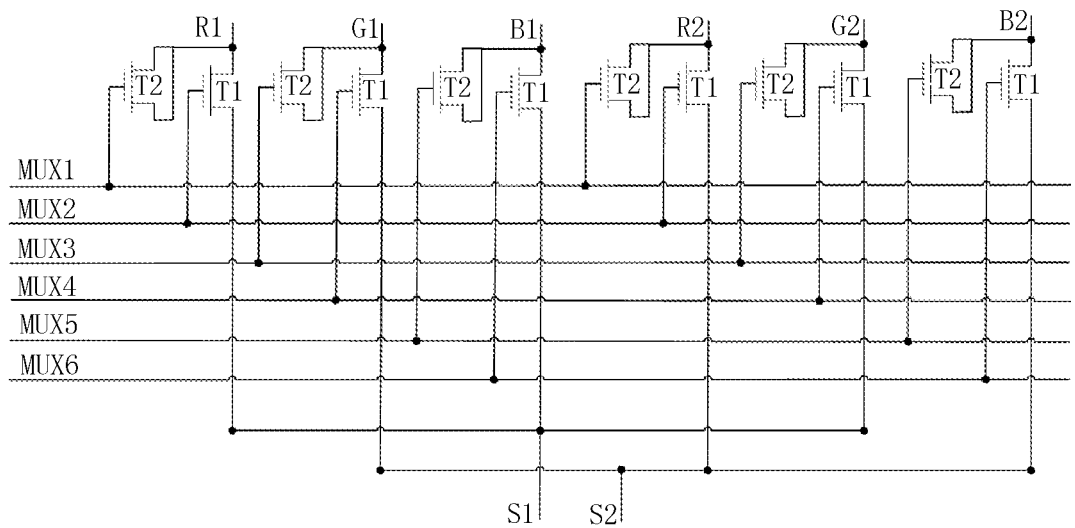
FIG. 4 is a circuit connection diagram of another signal selector according to an embodiment of the present disclosure.

As shown in FIG. 4, the signal selector may include two switch unit groups, and the two switch unit groups include six switch units, where three switch units drive the first red sub-pixel R1, the second green sub-pixel G2, and the first blue sub-pixel B1, and the other three switch units drive the second red sub-pixel R2, the first green sub-pixel G1 and the second blue sub-pixel B2. The first signal line includes a first sub-signal line MUX1, a third sub-signal line MUX3 and a fifth sub-signal line MUX5, and the second signal line includes a second sub-signal line MUX2, a fourth sub-signal line MUX4 and a sixth sub-signal line MUX6.

The six switch units include six switch circuits. Control terminals of switch circuits corresponding to the first red sub-pixel R1 and the second red sub-pixel R2 are electrically coupled to the second sub-signal line MUX2, control terminals of switch circuits corresponding to the first green sub-pixel G1 and the second green sub-pixel G2 are electrically coupled to the fourth sub-signal line MUX4, and control terminals of switch circuits corresponding to the first blue sub-pixel B1 and the second blue sub-pixel B2 are electrically coupled to the sixth sub-signal line MUX6.

There are two first input data lines, which include a first sub-input data line S1 and a second sub-input data line S2. The first sub-input data line S1 may be electrically coupled to input terminals of switch circuits of the first red sub-pixel R1, the second green sub-pixel G2 and the first blue sub-pixel B1 to input a total data signal to the first red sub-pixel R1, the second green sub-pixel G2 and the first blue sub-pixel B1 in the display area. The second sub-input data line S2 may be electrically coupled to input terminals of switch circuits of the second red sub-pixel R2, the first green sub-pixel G1, and the second blue sub-pixel B2 to input a total data signal to the second red sub-pixel R2, the first green sub-pixel G1, and the second blue sub-pixel B2 in the display area.

There are six output data lines, of which three output data lines are respectively coupled to the first red sub-pixel R1, the second green sub-pixel G2, and the first blue sub-pixel B1 to input sub-data signals to the first red sub-pixel R1, the second green sub-pixel G2, and the first blue sub-pixel B1 in the display area, and the other three output data lines are respectively coupled to the second red sub-pixel R2, the first green sub-pixel G1 and the second blue sub-pixel B2 to input sub-data signals to the second red sub-pixel R2, the first green sub-pixel G1, and the second blue sub-pixel B2 in the display area.

Six switch units include six boost circuits. A first terminal of a boost circuit of the first red sub-pixel R1 is electrically coupled to an output terminal of the switch circuit of the first red sub-pixel R1. A first terminal of a boost circuit of the second red sub-pixel R2 is electrically coupled to an output terminal of the switch circuit of the second red sub-pixel R2. A first terminal of a boost circuit of the first green sub-pixel G1 is electrically coupled to an output terminal of the switch circuit of the first green sub-pixel G1. A first terminal of a boost circuit of the second green sub-pixel G2 is electrically coupled to an output terminal of the switch circuit of the second green sub-pixel G2. A first terminal of a boost circuit of the first blue sub-pixel B1 is electrically coupled to an output terminal of the switch circuit of the first blue sub-pixel B1. A first terminal of a boost circuit of the second blue sub-pixel B2 is electrically coupled to an output terminal of the switch circuit of the second blue sub-pixel B2.

A control terminal of the boost circuit of the first red sub-pixel R1 is electrically coupled to the first sub-signal line MUX1. A control terminal of the boost circuit of the second red sub-pixel R2 is electrically coupled to the first sub-signal line MUX1. A control terminal of the boost circuit of the first green sub-pixel G1 is electrically coupled to the third sub-signal line MUX3. A control terminal of the boost circuit of the second green sub-pixel G2 is electrically coupled to the third sub-signal line MUX3. A control terminal of the boost circuit of the first blue sub-pixel B1 is electrically coupled to the fifth sub-signal line MUX5. A control terminal of the boost circuit of the second blue sub-pixel B2 is electrically coupled to the fifth sub-signal line MUX5.

Figure 5:
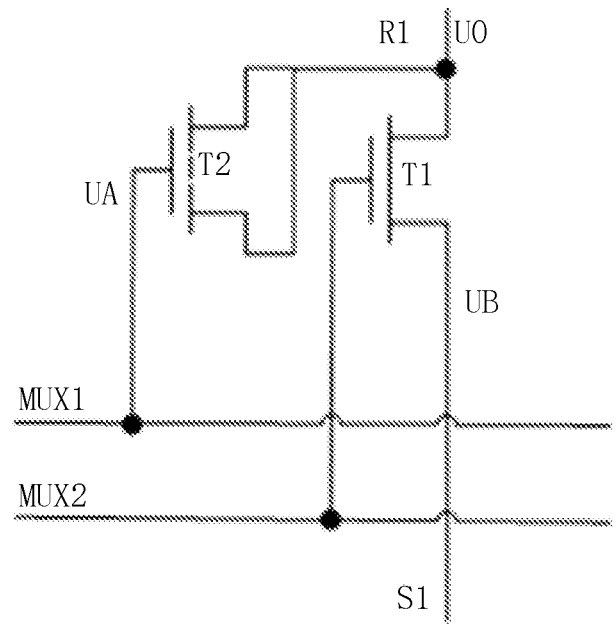
FIG. 5 is a circuit connection diagram of a first red sub-pixel R1 of another signal selector in a case that a boost circuit is a boost transistor according to an embodiment of the present disclosure.

As shown in FIG. 5, the switch circuit may include a switch transistor T1. A source of the switch transistor T1 is a first terminal of the switch circuit, a drain of the switch transistor T1 is a second terminal of the switch circuit, and a gate of the switch transistor T1 is a control terminal of the switch circuit. The control terminal of the switch circuit is electrically coupled to the second signal line. The boost circuit may include a boost transistor T2, a first terminal and a second terminal of the boost transistor T2 are short-circuited to be used as the first terminal of the boost circuit, and the first terminal of the boost circuit is electrically coupled to the second terminal of the switch circuit. The gate of the boost transistor T2 is used as the control terminal of the boost circuit, and the control terminal of the boost circuit is configured to load the boost control signal, the control terminal of the boost circuit is electrically coupled to the first signal line.

The use of a capacitive coupling effect generated by the boost transistor T2 can realize the rapid rise and fall of the voltage at the distal end of the output data line, thereby achieving the charging specification of the medium-to-large sized and high resolution display panel. An advantage of the boost transistor T2 is that the capacitance of the boost transistor T2 can be adjusted by adjusting a magnitude of a gate voltage of the boost transistor T2, and the boost transistor T2 and the surrounding switch transistor T1 do not affect each other, which are more convenient to use. The boost transistor T2 may be disposed on the same layer as the switch transistor T1 without increasing the thickness of the display panel.

Figure 6:
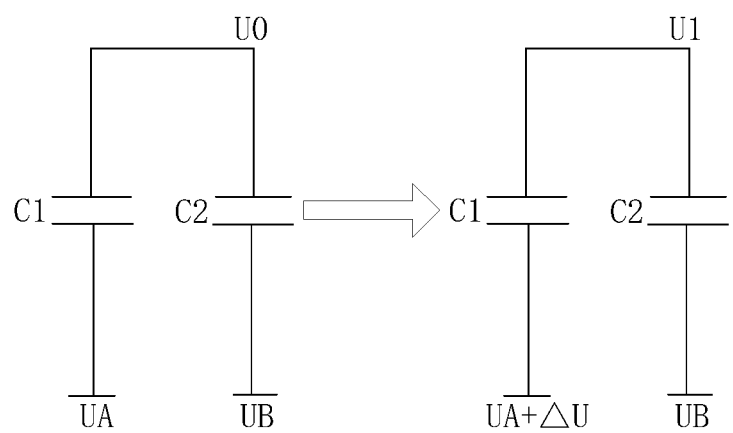
FIG. 6 is a schematic circuit diagram of a first red sub-pixel R1 of another signal selector according to an embodiment of the present disclosure.

As shown in FIG. 6, the first sub-signal line MUX1 that controls the output of the first red sub-pixel R1 is taken as an example to illustrate a working principle of the signal selector. A capacitor C1 is a capacitor of the boost transistor, a capacitor C2 is a capacitor on the output data line coupled to the first red sub-pixel R1, UA is a voltage of the boost transistor T2, UB is a voltage of the first sub-input data line S1, and U0 is a voltage of the output data line coupled to the first red sub-pixel R1. When the voltage UA suddenly increases by AU, since a voltage across the capacitor C1 cannot change suddenly, a voltage at the other terminal of the capacitor C1 also increases by AU, and since the capacitor C1 and the capacitor C2 are coupled together, there is a flow of charge between the capacitor C1 and the capacitor C2. Finally, voltages of the capacitor C1 and the capacitor C2 are consistent, and a voltage value of U1 after the balance is realized is:

$$U_1 = U_0 + \Delta U \times \frac{C1}{(C1+C2)}.$$

As shown in FIG. 7, in other embodiments of the present disclosure, the switch circuit may include a boost capacitor C3, an electrode plate of the boost capacitor C3 is used as the first terminal of the boost circuit to be electrically coupled to the output terminal of the switch circuit, and the other electrode plate of the boost capacitor is used as the second terminal of the boost circuit to load the boost control signal.

As shown in FIG. 8, the present disclosure further provides a driving method for a signal selector. When a boost circuit includes a boost transistor, the driving method may include steps S10 to S30.

In the step S10, in a preparation period, a preparation voltage is loaded to a gate of the boost transistor to make a Vgs of the boost transistor not less than a Vth of the boost transistor.

In the step S20, in a data write period after the preparation period, a write signal is loaded to a control terminal of a switch circuit.

In the step S30, in a pull-up period after the data write period, a boost control signal is loaded to a control terminal of the boost transistor.

Figure 9:
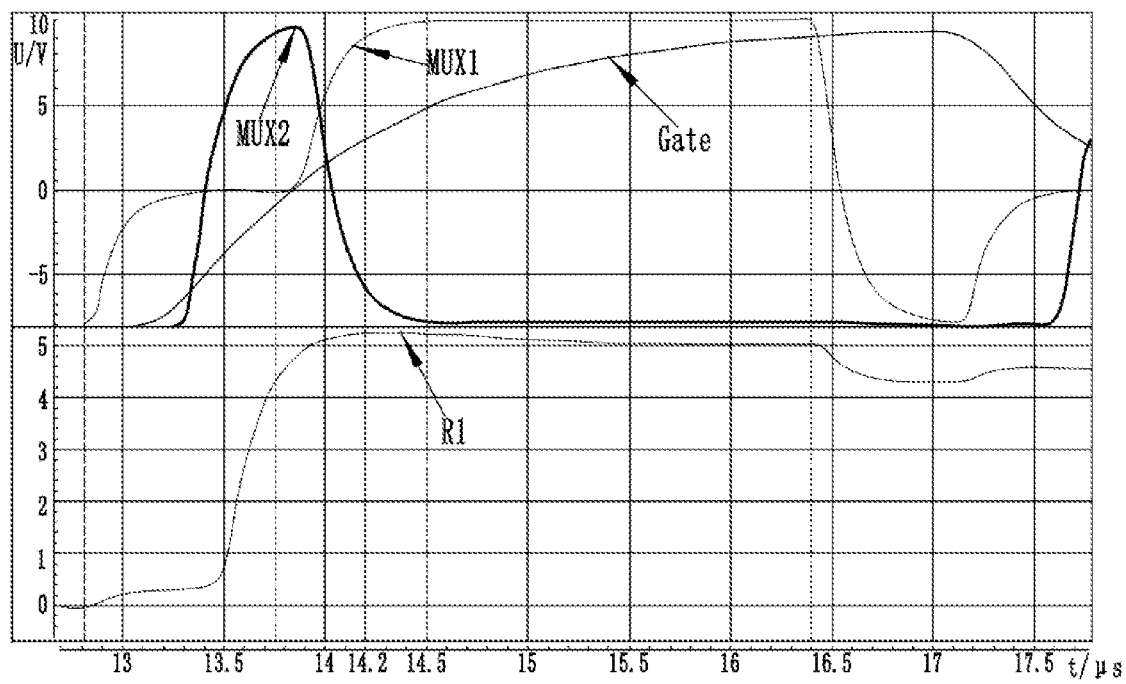
FIG. 9 is a schematic diagram of a coupling process of another signal selector according to an embodiment of the present disclosure.

As shown in FIG. 9, in the preparation period, a gate voltage Vg of the boost transistor T2 increases from −8V to 0V, and at this time, the voltage Vgs of the boost transistor T2 is greater than Vth, a capacitance value of the boost transistor T2 reaches the maximum value, and a voltage on the output data line coupled to the first red sub-pixel R1 is increased from 0V to 0.4V under the driving by the driving chip electrically coupled to the first sub-input data line S1.

Figure 10:
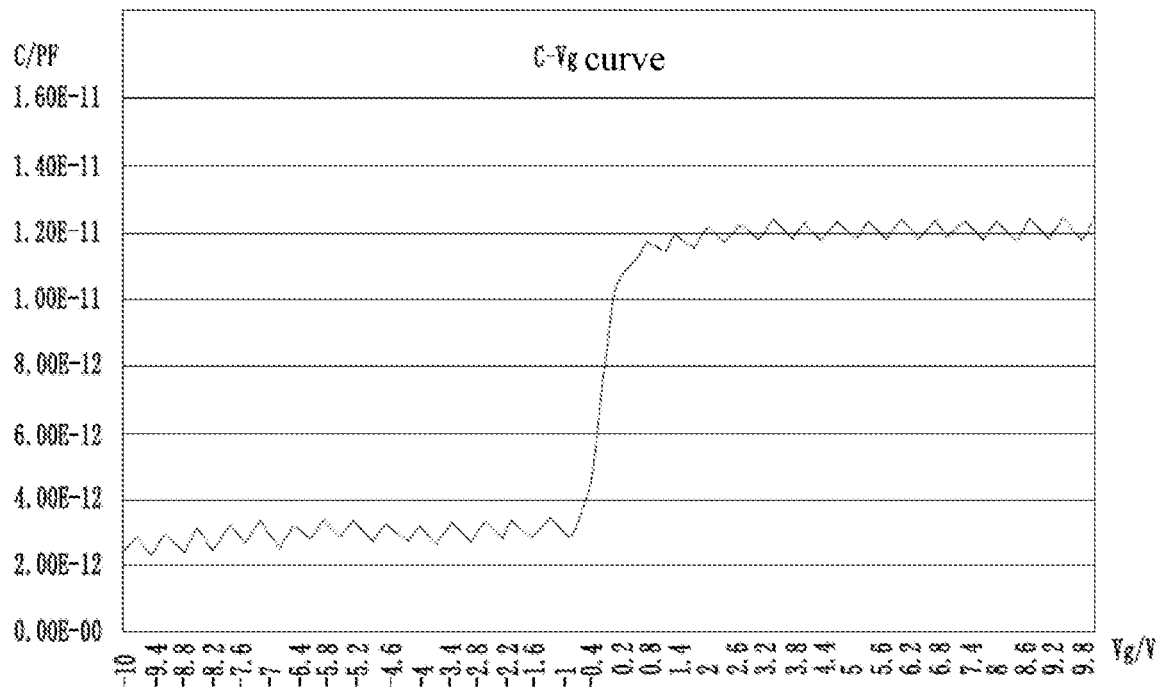
FIG. 10 is a graph of a relationship between a capacitance and a gate voltage of a boost transistor in a case that a boost circuit is the boost transistor according to an embodiment of the present disclosure.

A relationship graph between the capacitance C1 and the gate voltage Vg of the boost transistor T2 is shown in FIG. 10. It can be seen that when Vgs is greater than Vth, the capacitance C1 of the boost transistor T2 reaches the maximum value; during the pull-up period, the gate voltage of the boost transistor T2 is increased from 0V to +8V, the voltage on the output data line coupled to the first red sub-pixel R1 is increased from 4V to 5.26V, and a coupling effect of the boost transistor T2 mainly occurs at this stage.

It can be understood that due to the coupling effect of the boost transistor T2, the maximum voltage that can be charged on the output data line coupled to the first red sub-pixel R1 is 5.26V, and the charging ratio of the display panel is 5.26/5.3=0.9924, which meets the charging ratio specification of 0.99 required by the display panel.

It should be emphasized that during the driving process of the signal selector, a lag time of a falling edge of the write signal relative to a falling edge of the boost signal is at least greater than one pulse width of the write signal to prevent the pull-down effect on a pixel voltage by the falling edge of the boost signal. Typically, one pulse width of the write signal is approximately 0.65 μs.

It should be noted that Vgs is a voltage difference between the control terminal and the first terminal of the boost transistor T2, Vth is the threshold voltage, which is typically 0V, and the control terminal is the gate of the boost transistor T2, the first terminal is the source of the boost transistor T2.

Figure 11:
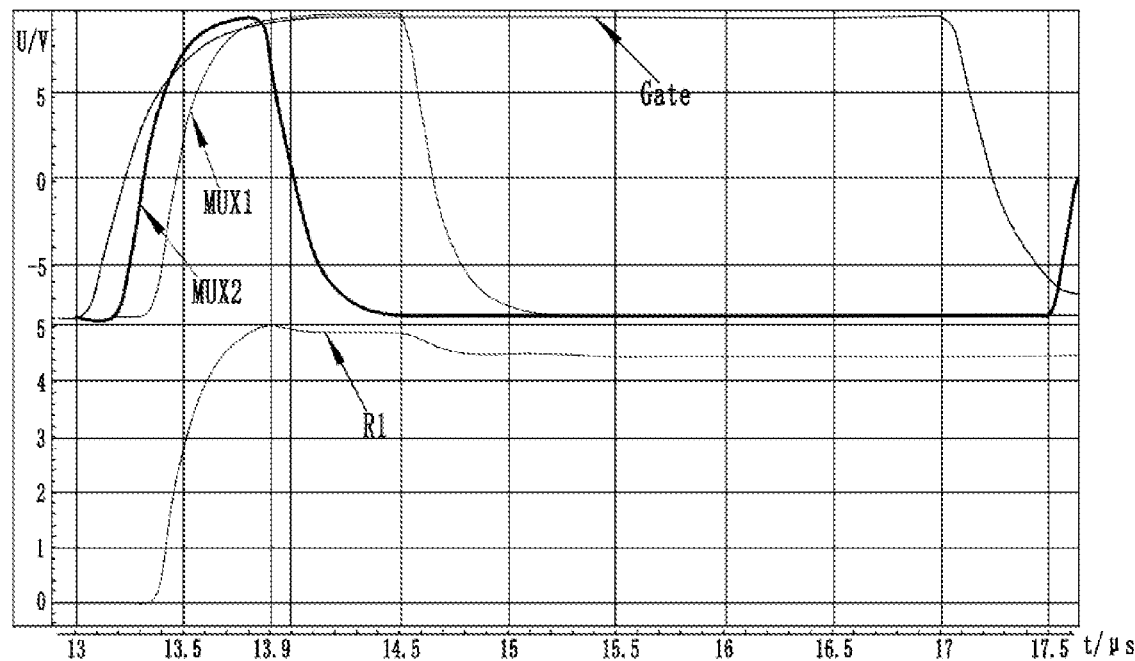
FIG. 11 is a schematic diagram of another coupling process of another signal selector according to an embodiment of the present disclosure.

As shown in FIG. 11, when the boost circuit includes the boost transistor, in the driving method for the signal selector in other embodiments of the present disclosure, the first sub-signal line MUX1 is turned on lagging behind the second sub-signal line MUX2. The driving method first increases the voltage loaded on the second sub-signal line MUX2 from −8V to 8V, and the voltage on the output data line coupled to the first red sub-pixel R1 is increased from 0V to 4.9V under the driving by the driving chip electrically coupled to the first sub-input data line S1.

Then the voltage loaded on the first sub-signal line MUX1 is increased from −8V to 8V. Under the capacitive coupling of the boost transistor, the voltage of the output data line coupled to the first red sub-pixel R1 is increased from 4.9V to 5.02V, which is only 0.04V higher than the 4.98V of the signal selector in the figure, and the improvement effect is not obvious. The reason is that when the first sub-signal line MUX1 is increased from −8V to 8V, the capacitance value of the boost transistor reaches the maximum value, so the coupling effect is poor.

The present disclosure provides a display panel. As shown in FIGS. 12 to 20, the display panel includes a base substrate BP, a driving circuit layer and a color film layer that are stacked in sequence. The color film layer is provided with filter parts distributed in an array, and the driving circuit layer is provided with driving circuits in a one-to-one correspondence with respective sub-pixels, the respective sub-pixels control rotation directions of liquid crystal molecules under the driving by the corresponding driving circuits, to achieve the purpose of display by controlling whether the polarized light of each sub-pixel point is emitted, thereby displaying the corresponding image.

In the driving circuit layer, the display panel may be provided with a scan line extending along a first direction and a data line extending along a second direction, and the display panel may perform scanning row by row to display a picture. It should be noted that the first direction is generally regarded as a row direction, and the second direction is generally regarded as a column direction.

Figure 12:
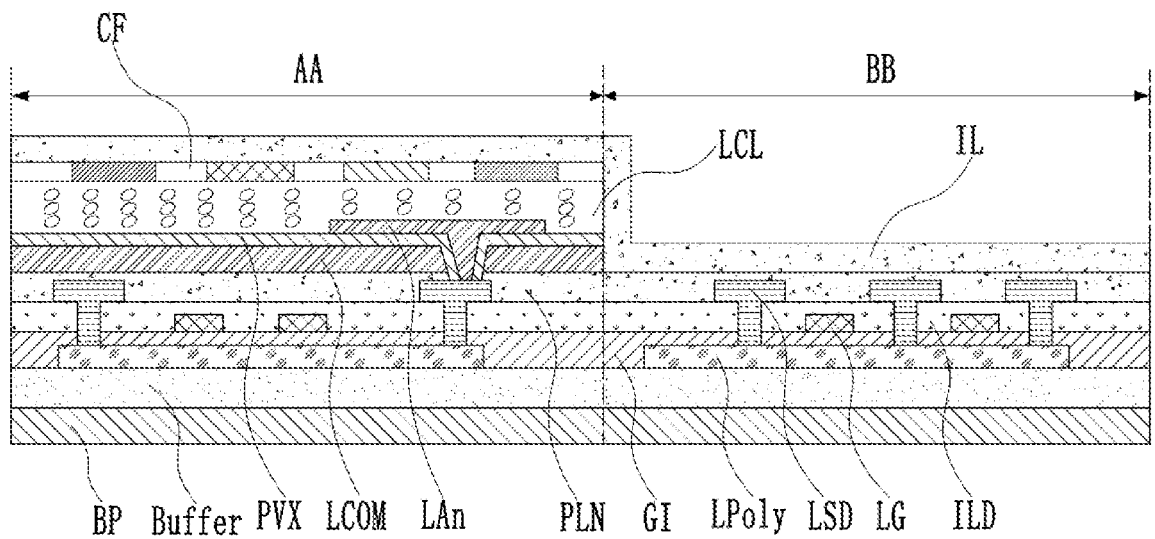
FIG. 12 is a schematic cross-sectional view of a display panel according to an embodiment of the present disclosure.
Figure 13:
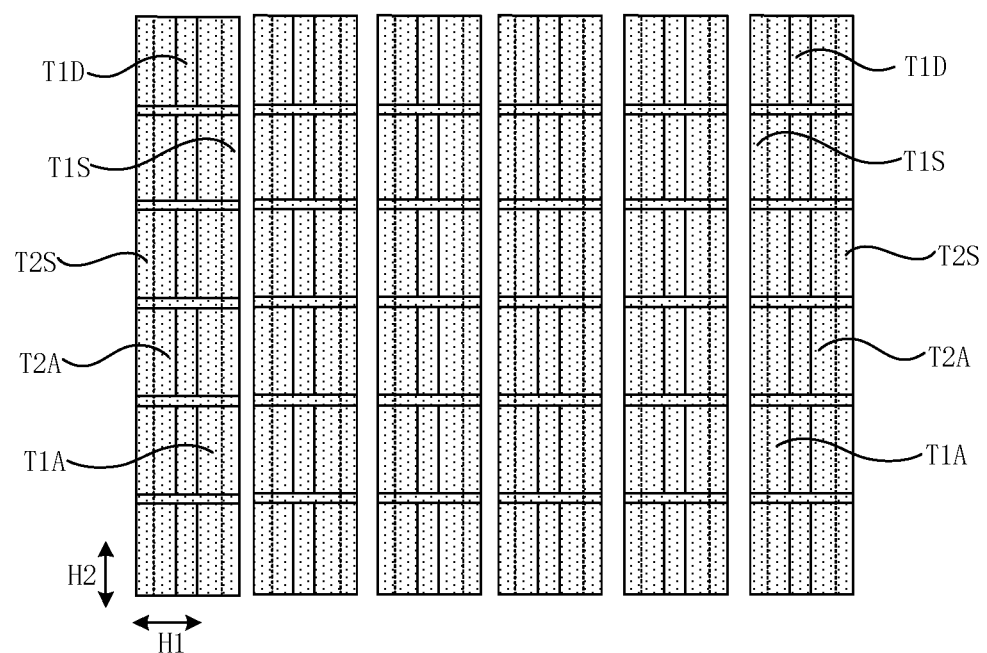
FIG. 13 is a schematic structural diagram of an active layer of a display panel in a non-display area according to an embodiment of the present disclosure.
Figure 14:
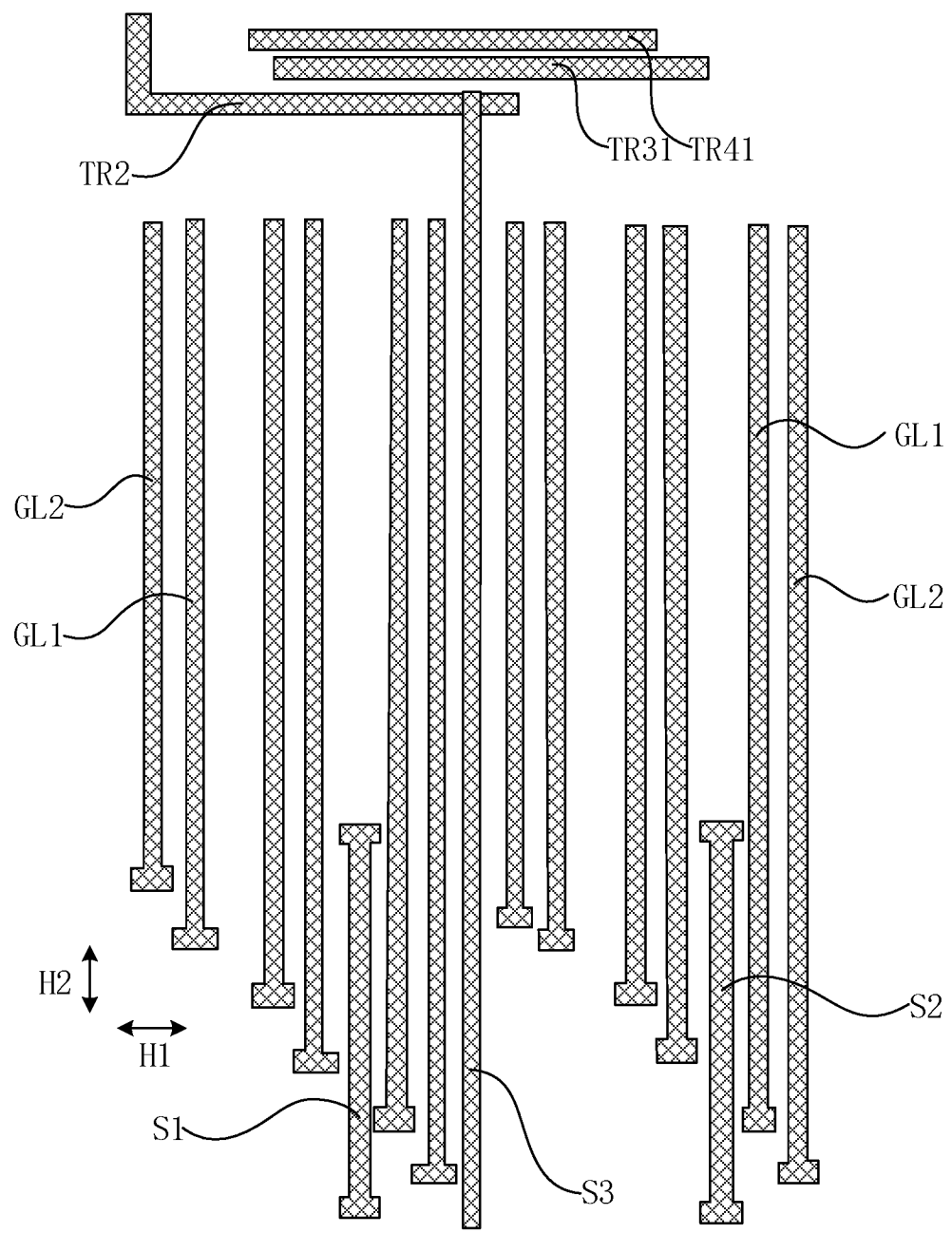
FIG. 14 is a schematic structural diagram of a gate layer of a display panel in a non-display area according to an embodiment of the present disclosure.
Figure 15:
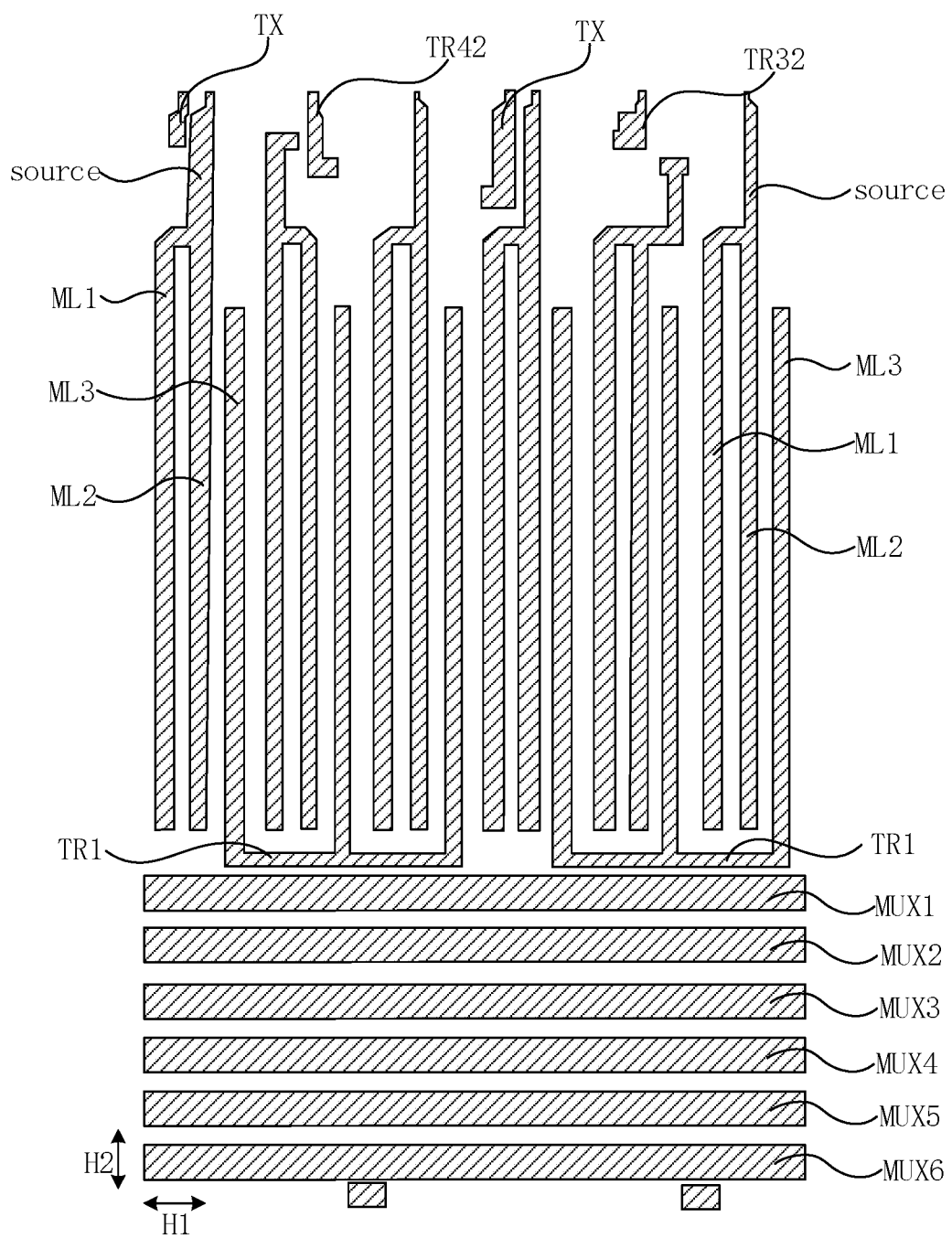
FIG. 15 is a schematic structural diagram of a source-drain metal layer of a display panel in a non-display area according to an embodiment of the present disclosure.
Figure 16:
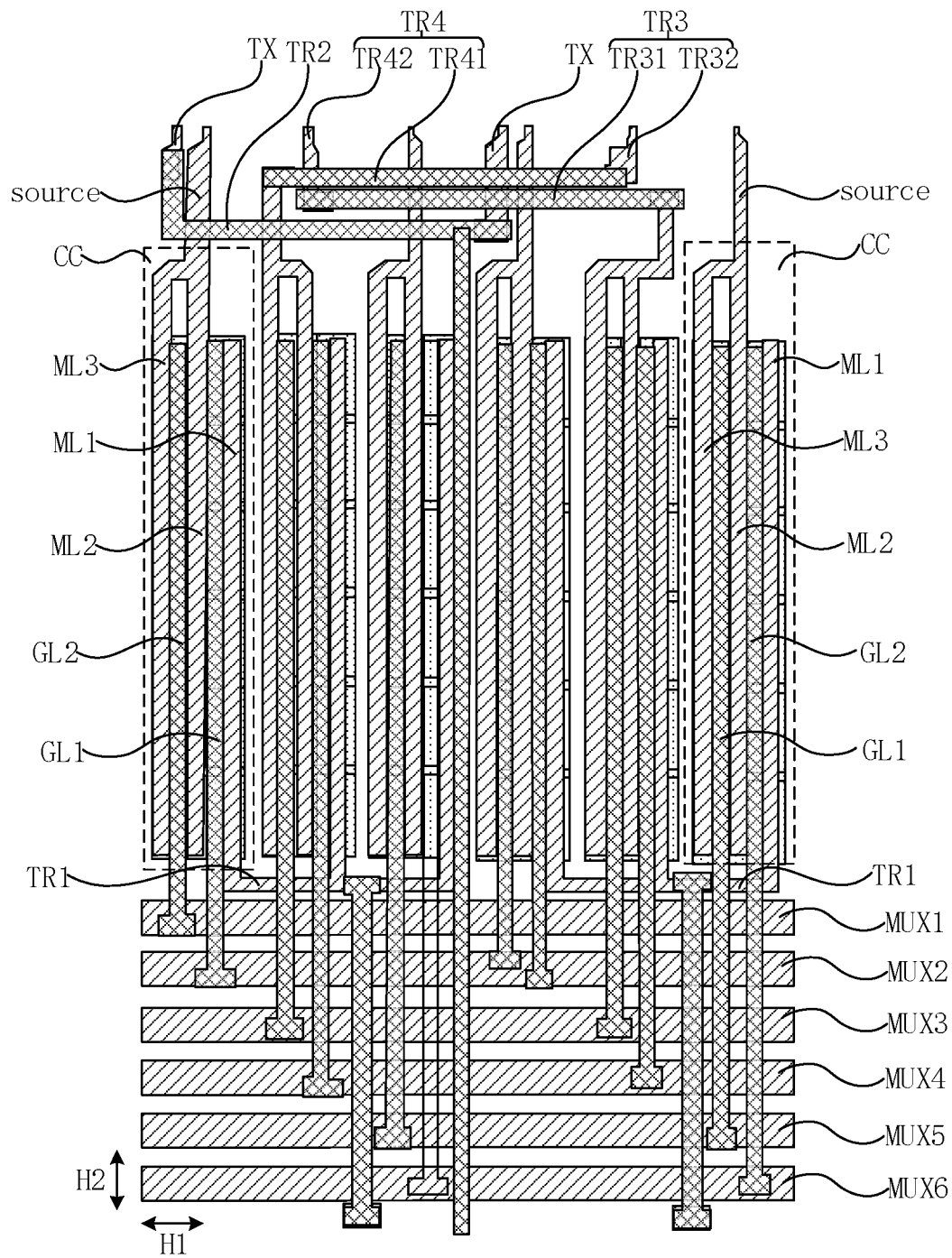
FIG. 16 is a layout of a display panel according to an embodiment of the present disclosure.
Figure 17:
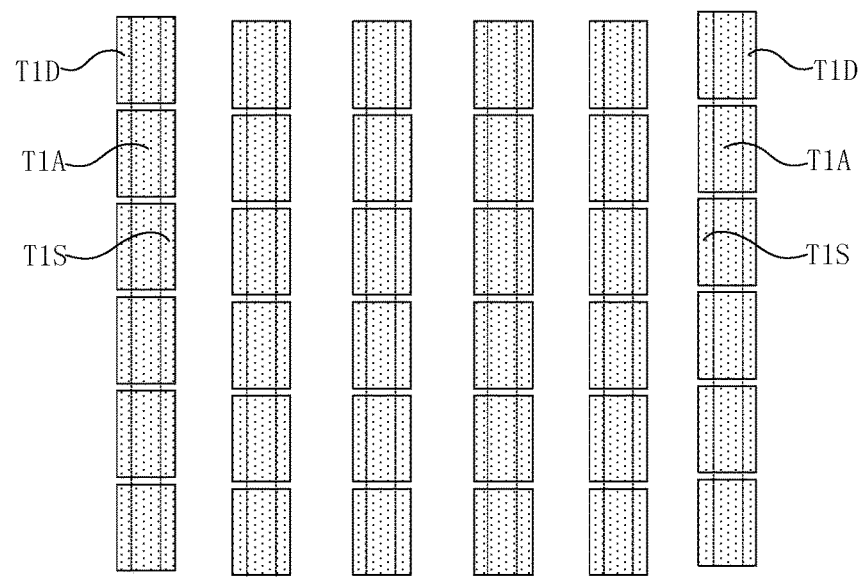
FIG. 17 is a schematic structural diagram of an active layer of another display panel in a non-display area according to an embodiment of the present disclosure.
Figure 18:
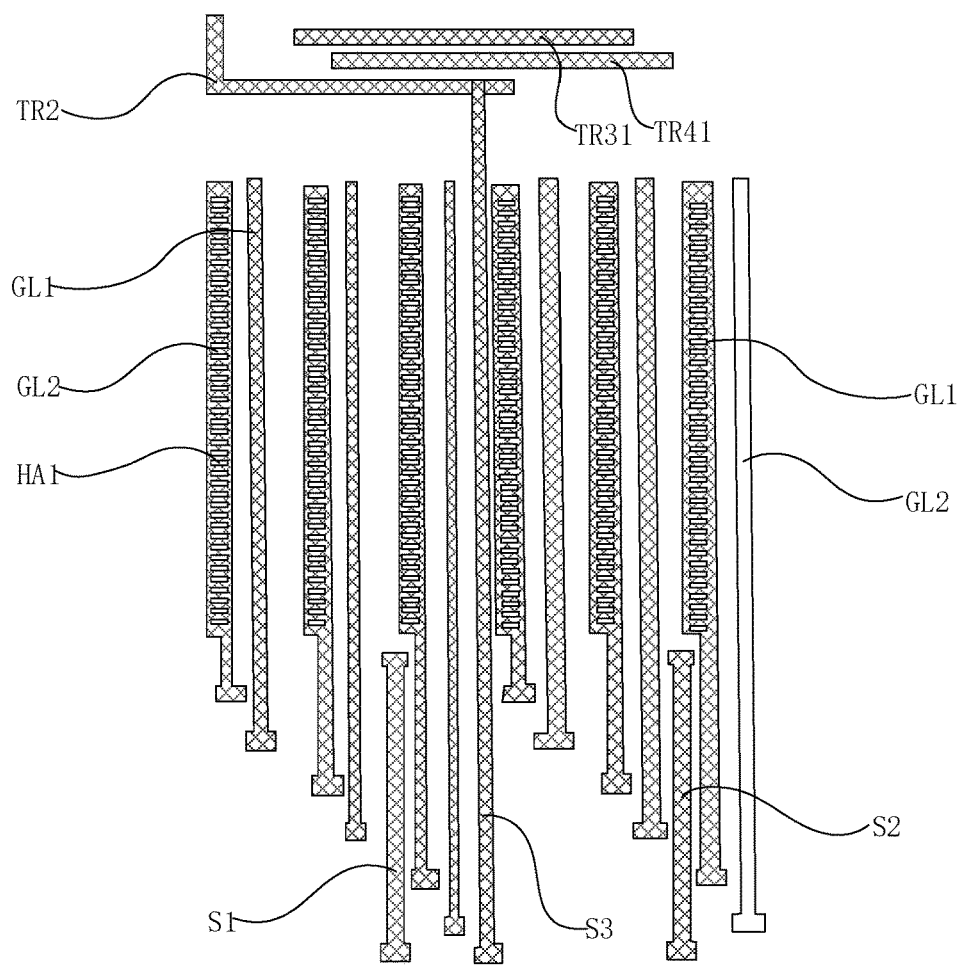
FIG. 18 is a schematic structural diagram of a gate layer of another display panel in a non-display area according to an embodiment of the present disclosure.
Figure 19:
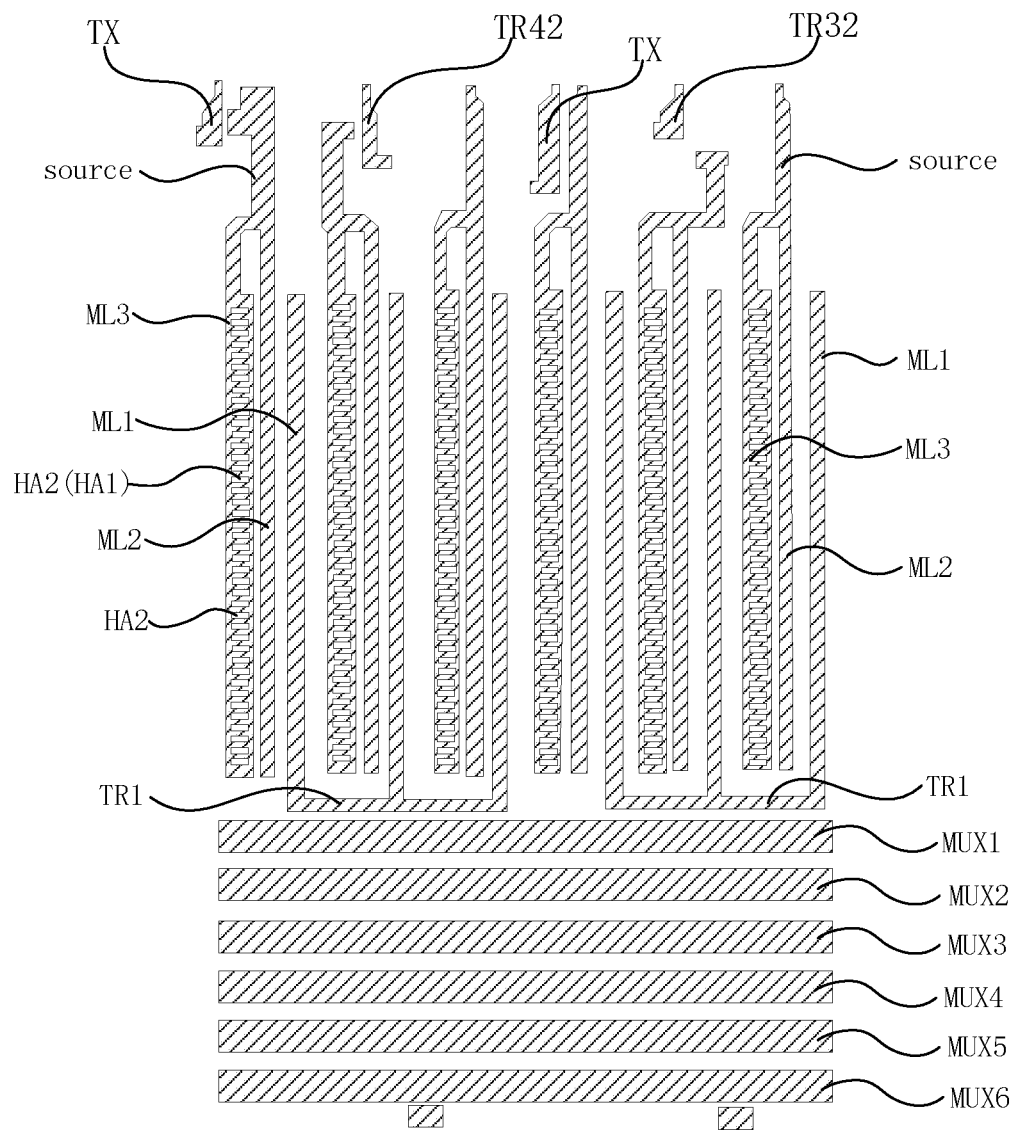
FIG. 19 is a schematic structural diagram of a source-drain metal layer of another display panel in a non-display area according to an embodiment of the present disclosure.
Figure 20:
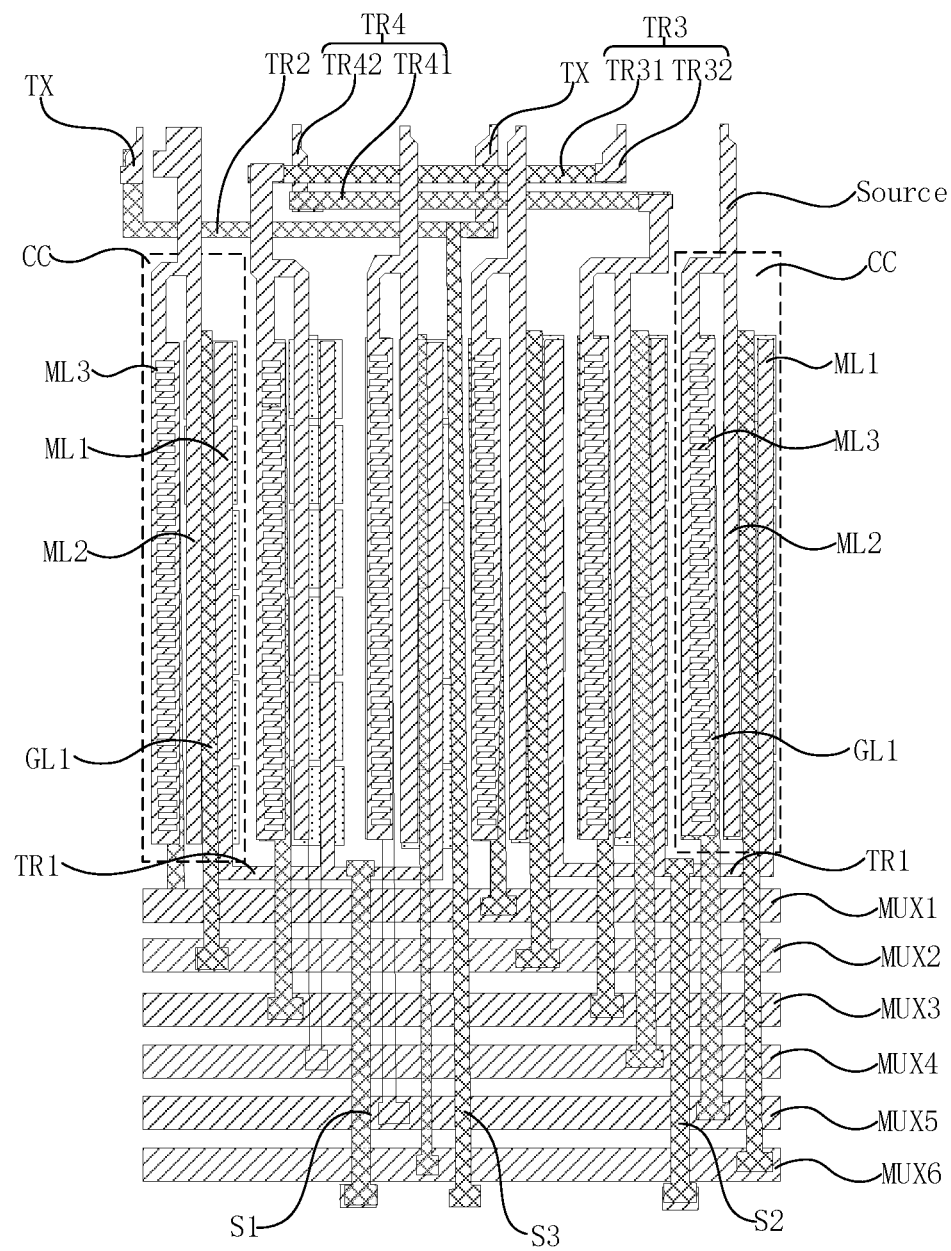
FIG. 20 is a layout of another display panel according to an embodiment of the present disclosure.

Referring to FIG. 12, from the perspective of film layer stacking, the display panel of the present disclosure may include the base substrate BP, a buffer layer Buffer and the driving circuit layer that are stacked in sequence. The buffer layer Buffer is disposed on a side of the base substrate BP, and the driving circuit layer is disposed on a side of the buffer layer Buffer away from the base substrate BP.

The base substrate BP11 may be a base substrate BP of an inorganic material or a base substrate BP of an organic material. For example, in an embodiment of the present disclosure, the material of the base substrate BP may be a glass material such as soda-lime glass, quartz glass, sapphire glass, or may be a metal material such as stainless steel, aluminum, nickel.

In another embodiment of the present disclosure, the material of the base substrate BP may be polymethyl methacrylate (PMMA), polyvinyl alcohol (PVA), polyvinyl phenol (PVP), polyether sulfone (PES), polyimide, polyamide, polyacetal, poly carbonate (PC), polyethylene terephthalate (PET), polyethylene naphthalate (PEN) or a combination thereof.

In another embodiment of the present disclosure, the base substrate BP may also be a flexible base substrate BP. For example, the material of the base substrate BP may be polyimide (PI). The base substrate BP may also be a composite of multiple layers of materials. For example, in an embodiment of the present disclosure, the base substrate BP may include a bottom film layer, a pressure-sensitive adhesive layer, a first polyimide layer and a second polyimide layer that are stacked in sequence.

The driving circuit layer includes a plurality of driving circuit areas. Any driving circuit area may include a transistor and a storage capacitor. The transistor may be a thin film transistor, and the thin film transistor may be selected from a top gate thin film transistor, a bottom gate thin film transistor, or a dual gate thin film transistor.

A material of an active layer of the thin film transistor may be an amorphous silicon semiconductor material, a low temperature polysilicon semiconductor material, a metal oxide semiconductor material, an organic semiconductor material or other types of semiconductor materials. The thin film transistor may be an N-type thin film transistor or a P-type thin film transistor.

The transistor may have a first terminal, a second terminal, and a control terminal. One of the first terminal and the second terminal may be a source of the transistor and the other may be a drain of the transistor, and the control terminal may be a gate of the transistor. It can be understood that the source and the drain of the transistor are two corresponding and interchangeable concepts, and when a working state of the transistor changes, for example, a current direction changes, the source and the drain of the transistor may be interchanged.

In the present disclosure, the driving circuit layer may include a transistor layer, an interlayer dielectric layer ILD, and a source-drain metal layer LSD that are sequentially stacked on the base substrate BP. The transistor layer is provided with the active layer and the gate of the transistor, and the source-drain metal layer LSD is electrically coupled to the source and the drain of the transistor. In an embodiment of the present disclosure, the transistor layer may include an active layer Lpoly, a gate insulation layer GI, and a gate layer LG stacked between the base substrate BP and the interlayer dielectric layer ILD. A positional relationship of respective film layers may be determined according to a film layer structure of the thin film transistor.

In some embodiments of the present disclosure, the active layer Lpoly may be used to form the active layer of the transistor, and the semiconductor active layer includes a channel region and a source and a drain located on both sides of the channel region. The channel region can maintain a semiconductor property, and semiconductor materials of the source and the drain are partially or completely conductive. The gate layer LG may be used to form gate layer lines such as a scan line, or may also be used to form the gate of the transistor, or may also be used to form part or all of electrode plates of the storage capacitor. The source-drain metal layer LSD may be used to form source-drain metal layer lines such as a data line and a power line.

Taking the top gate thin film transistor as an example, in some embodiments of the present disclosure, the driving circuit layer may include the active layer Lpoly, the gate insulation layer GI, the gate layer LG, the interlayer dielectric layer ILD and the source-drain metal layer LSD that are stacked in sequence.

The display panel has a display area AA and a non-display area BB disposed at a periphery of the display area AA. Each driving circuit area includes a switch circuit area and a driving transistor. The switch circuit area is located in the non-display area BB, and the driving transistor is located in the display area AA. The switch circuit area includes a switch transistor, and a control terminal of the driving transistor may be coupled to a second terminal of the switch transistor.

When the display panel is an LCD display panel, on the basis of the above, the driving circuit layer of the display area AA in the display panel may further include a planarization layer PLN. Depending on different situations, the planarization layer PLN may be disposed as one layer or a plurality of layers. The planarization layer PLN may be disposed on a side of the source-drain metal layer LSD of the driving transistor away from the base substrate BP, and a surface of the planarization layer PLN away from the base substrate BP is flat. A plurality of first via holes that expose the source-drain metal layer LSD of the driving transistor are disposed at intervals in the planarization layer PLN. A common electrode LCOM may be disposed on the side of the planarization layer PLN away from the base substrate BP. A plurality of second via holes are disposed at intervals in the common electrode LCOM. An orthographic projection of the second via hole on the base substrate BP is located within an orthographic projection of the first via hole on the base substrate BP.

A protective layer PVX is disposed on a side of the common electrode LCOM away from the base substrate BP, and the protective layer PVX covers the side of the common electrode LCOM away from the base substrate BP. The protective layer PVX extends from a position where the common electrode LCOM is provided with the second via hole and a position where the planarization layer PLN is provided with the first via hole to the source-drain metal layer LSD of the driving transistor. An end of the protective layer PVX close to the base substrate BP partially covers the source-drain metal layer LSD of the driving transistor, forming an opening exposing part of the source-drain metal layer LSD of the driving transistor. A plurality of pixel electrodes LAn are disposed on a side of the protective layer PVX away from the base substrate BP, and the pixel electrode Lan is disposed in the opening and is coupled to the source-drain metal layer LSD of the driving transistor.

A liquid crystal layer LCL is disposed on a side of the pixel electrode LAn away from the source-drain metal layer LSD of the driving transistor. The liquid crystal layer LCL covers the protective layer PVX and the source-drain metal layer LSD of the driving transistor. Since there is the protective layer PVX between the pixel electrode LAn and the common electrode LCOM, and both the pixel electrode LAn and the common electrode LCOM have driving surfaces, the liquid crystal layer LCL may be considered to be located between the pixel electrode LAn and the common electrode LCOM.

The color film layer CF is disposed on a side of the liquid crystal layer LCL away from the base substrate. The insulation layer IL may be disposed on a side of the color film layer CF in the display area AA and the planarization layer PLN in the non-display area BB away from the base substrate BP. The insulation layer IL extends from a surface of the color film layer CF away from the base substrate BP to a side of the color film layer CF, a side of the liquid crystal layer LCL, a side of the protective layer PVX and a side of the common electrode LCOM, and covers the side of the planarization layer PLN in the non-display area BB away from the base substrate.

As shown in FIGS. 13 to 16, in the non-display area of the display panel, the active layer Lpoly includes a first active part T1A, a third active part T1S, and a fourth active part T1D.

The gate layer LG includes a first control lead GL1 and a first input data line arranged along a first direction H1. An orthographic projection of the first control lead GL1 on the base substrate BP is overlapped with an orthographic projection of the first active part T1A on the base substrate BP, forming the gate of the switch transistor.

The source-drain metal layer LSD includes a first conductive structure ML1, a second conductive structure ML2 and an output data line Source arranged along the first direction H1. The first conductive structure ML1 is coupled to the first input data line. An orthographic projection of the first conductive structure ML1 on the base substrate BP is overlapped with an orthographic projection of the third active part T1S on the base substrate BP, and the first conductive structure ML1 is coupled to the third active part T1S, forming the source of the switch transistor. An orthographic projection of the second conductive structure ML2 on the base substrate BP is overlapped with an orthographic projection of the fourth active part T1D on the base substrate BP, and the second conductive structure ML2 is coupled to the fourth active part T1D, forming the drain of the switch transistor and the drain of the boost transistor. The second conductive structure ML2 is coupled to the output data line Source.

The switch circuit area CC further includes a boost circuit. When the boost circuit of the display panel is a boost transistor, the active layer Lpoly further includes a second active part T2A and a fifth active part T2S. The gate layer LG further includes a second control lead GL2, and an orthographic projection of the second control lead GL2 on the base substrate BP is overlapped with an orthographic projection of the second active part T2A on the base substrate BP, forming the gate of the boost transistor.

The source-drain metal layer LSD further includes a third conductive structure ML3. An orthographic projection of the third conductive structure ML3 on the base substrate BP is overlapped with an orthographic projection of the fifth active part T2S on the base substrate BP, and the third conductive structure is coupled to the fifth active part T2S, forming the source of the boost transistor. The third conductive structure ML3 is coupled to the second conductive structure ML2, and both the third conductive structure ML3 and the second conductive structure ML2 are coupled to the output data line Source.

It should be noted that in the first direction H1, the orthographic projection of the second conductive structure ML2 on the base substrate BP is located between the orthographic projection of the first conductive structure ML1 on the base substrate BP and the orthographic projection of the third conductive structure ML3 on the base substrate BP. The orthographic projection of the second conductive structure ML2 on the base substrate BP is located outside the orthographic projection of the first control lead GL1 on the base substrate BP, and the orthographic projection of the third conductive structure ML3 on the base substrate BP is located outside the orthographic projection of the second control lead GL2 on the base substrate BP.

In addition, the source-drain metal layer LSD may further include a first signal line and a second signal line arranged along a second direction H2. The second signal line is coupled to the first control lead GL1, and the first signal line is coupled to the second control lead.

Taking a signal selector with six sub-signal lines as an example for illustration, the number of switch circuit areas CC is six, and the six switch circuit areas CC are divided into two switch circuit area groups. Each switch circuit area group forms a switch circuit island, and each switch circuit island includes three switch circuit areas CC arranged in sequence along the first direction H1. Output data lines Source of the three switch circuit areas CC are coupled to the red sub-pixel, the green sub-pixel and the blue sub-pixel, respectively.

Specifically, for the three switch circuit areas CC in the same switch circuit island, an output data line Source of a first switch circuit area CC is coupled to a control terminal of a driving transistor corresponding to a red sub-pixel, an output data line Source of a second switch circuit area CC is coupled to a control terminal of a driving transistor corresponding to the green sub-pixel, and an output data line Source of a third switch circuit area CC is coupled to a control terminal of a driving transistor corresponding to the blue sub-pixel.

The source-drain metal layer LSD further includes a first transfer line TR1. One first transfer line TR1 is coupled to each first conductive structure ML1 in a switch circuit area group, and the first sub-input data line S1 is coupled to the first transfer line TR1. Another first transfer line TR1 is coupled to each first conductive structure ML1 in another switch circuit area group, and the second sub-input data line S2 is coupled to the second transfer line TR2.

The gate layer LG may further include a second input data line S3, a touch signal line TX and a second transfer line TR2. The second transfer line TR2 extends along the first direction H1, and the second input data line S3 and the touch signal line TX extend along the second direction H2. The second input data line S3 is located on a side of the second transfer line TR2 close to the signal line, and the touch signal line TX is located on a side of the second transfer line TR2 away from the signal line. In the second direction, the second input data line S3 and the touch signal line TX are both coupled to the second transfer line TR2. Two touch signal lines TX may be provided, which are distributed on both sides of the second input data line S3 along the first direction H1. A touch signal on the second input data line S3 is distributed to different touch signal lines TX, and the touch signal line TX is configured to drive a touch electrode of the display panel.

In order to ensure the normal display of the display panel, it is typically necessary to ensure that polarities of data signals of adjacent sub-pixels are different, that is, if a data signal of one of two adjacent sub-pixels has a positive polarity, a data signal of the other of the two adjacent sub-pixels has a negative polarity. Typically, the first sub-input data line S1 and the second sub-input data line S2 input a positive total data signal and a negative total data signal, respectively. In order to ensure that positive and negative polarities of adjacent output sub-data signals are different, the transfer line needs to be provided to adjust the positive and negative polarities of particular output sub-data signals.

For example, the first sub-input data line S1 inputs the positive total data signal, and the second sub-input data line S2 inputs the negative total data signal. The sub-pixels include a first red sub-pixel R1, a first green sub-pixel G1, a first blue sub-pixel B1, a second red sub-pixel R2, a second green sub-pixel G2 and a second blue sub-pixel B2 sequentially distributed along the first direction. The first sub-input data line S1 and the second sub-input data line S2 respectively correspond to a group of output data lines Source, and the output data lines Source include a first output data line, a second output data line and a third output data line.

The first output data line corresponding to the first input data line S1 is coupled to the first red sub-pixel R1, the third output data line corresponding to the first input data line S1 is coupled to the first blue sub-pixel, the first output data line corresponding to the second input data line S2 is coupled to the second red sub-pixel, and the third output data line corresponding to the second input data line S2 is coupled to the second blue sub-pixel.

The display panel further includes a third transfer line TR3 and a fourth transfer line TR4. The second output data line corresponding to the first input data line S1 is coupled to the third transfer line TR3, and the third transfer line TR3 is coupled to the second green sub-pixel G2. The second output data line corresponding to the second input data line S2 is coupled to the fourth transfer line TR4, and the fourth transfer line TR4 is coupled to the first green sub-pixel G1.

The third transfer line TR3 may include a first transfer section TR31 and a second transfer section TR32. The first transfer section TR31 is coupled to an output data line Source coupled to the first green sub-pixel G1, and is coupled to the second transfer section TR32. The second transfer section TR32 is coupled to a source of a driving transistor of the second green sub-pixel G2. The fourth transfer line TR4 may include a third transfer section TR41 and a fourth transfer section TR42. The third transfer section TR41 is coupled to an output data line Source coupled to the second green sub-pixel G2, and is coupled to the fourth transfer section TR52. The fourth transfer section TR52 is coupled to a source of a driving transistor of the first green sub-pixel G1.

Accordingly, sub-data signals of the first red sub-pixel R1, the second green sub-pixel G2, the first blue sub-pixel B1, the second red sub-pixel R2, the first green sub-pixel G1 and the second blue sub-pixel B2 are "positive, negative, positive, negative, positive, negative" in sequence, meeting the display requirement of the display panel.

As shown in FIGS. 17 to 20, the present disclosure provides another display panel. A difference between this display panel and the display panel in FIGS. 13 to 16 is that the boost circuit is a boost capacitor.

When the boost circuit is the boost capacitor, the active layer Lpoly only includes the third active part T1S, the fourth active part T1D, and the first active part T1A, which is used to form the source, the drain and the gate of the switch transistor.

The gate layer LG includes the first control lead GL1, the second control lead GL2 and an input data line arranged along the first direction H1. The orthographic projection of the first control lead GL1 on the base substrate BP is overlapped with the orthographic projection of the first active part T1A on the base substrate BP, forming the gate of the switch transistor.

The source-drain metal layer LSD includes the first conductive structure ML1, the second conductive structure ML2, the third conductive structure ML3 and the output data line Source arranged along the first direction H1. In the first direction H1, the second conductive structure ML2 is located between the first conductive structure ML1 and the third conductive structure ML3, and the second conductive structure ML2 and the third conductive structure ML3 are coupled to the output data line Source.

The first conductive structure ML1 is coupled to the input data line. The orthographic projection of the first conductive structure ML1 on the base substrate BP is overlapped with the orthographic projection of the third active part T1S on the base substrate BP, and the first conductive structure ML1 is coupled to the third active part T1S, forming the source of the switch transistor. The orthographic projection of the second conductive structure ML2 on the base substrate BP is overlapped with the orthographic projection of the fourth active part T1D on the base substrate BP, and the second conductive structure ML2 is coupled to the fourth active part T1D, forming the drain of the switch transistor.

In addition, the source-drain metal layer LSD may further include the first signal line and the second signal line arranged along the second direction H2. The second signal line is coupled to the first control lead GL1, and the first signal line is coupled to the second control lead GL2.

In order to ensure a magnitude of the capacitance, areas of the second control lead GL2 and the third conductive structure ML3 are usually not too small. In order to prevent the formation of a large piece of metal, the second conductive structure is provided with a plurality of first through holes HA1 along the second direction H2, the third conductive structure is provided with a plurality of second through holes HA2 along the second direction H2, and an orthographic projection of the second through hole HA2 on the base substrate BP is located within an orthographic projection of the first through hole HA1 on the base substrate BP. More specifically, the orthographic projection of the second through hole HA2 on the base substrate BP may coincide with the orthographic projection of the first through hole HA1 on the base substrate BP.

An edge between a driving backplane and the color film layer is typically cured by optical curing glue. The light passes through the first through hole HA1 and the second through hole HA2, improving the curing effect for the optical curing glue, thereby affecting a fixing strength between the driving backplane and the color film layer CF. It should be noted that the optical curing glue may be UV glue.

Embodiments of the present disclosure provide a display device. The display device includes the display panel described in any one of the above embodiments of the present disclosure. The display device may also refer to the specific structure and beneficial effects of the display panel, which will not be described again here.

The display device may be a traditional electronic device, such as a mobile phone, a computer, a television, or a camcorder, or it may be an emerging wearable device, such as a virtual reality device and an augmented reality device, which are not listed here one by one.

It should be noted that, in addition to the display panel, the display device further includes other necessary components. Taking a mobile phone as an example, a housing, a circuit board, and the like may be included. Those skilled in the art can make corresponding supplements according to the specific usage requirements of the display device, which will not be repeated here.

It should be noted that although the various steps of the driving method in the present disclosure are described in a particular order in the figures, this is not required or implied that the steps must be performed in the specific order, or all the steps shown must be performed to achieve the desired result. Additionally or alternatively, certain steps may be omitted, multiple steps may be combined into one step, and/or one step may be decomposed into multiple steps and so on.

Other embodiments of the present disclosure will be apparent to those skilled in the art after those skilled in the art consider the specification and practice the technical solutions disclosed herein. The present application is intended to cover any variations, uses, or adaptations of the present disclosure, which are in accordance with the general principles of the present disclosure and include common general knowledge or conventional technical means in the art that are not disclosed in the present disclosure. The specification and embodiments are illustrative, and the real scope and spirit of the present disclosure is defined by the appended claims.

What is claimed is:

1. A signal selector, configured to distribute a signal on an input data line to different output data lines, wherein each output data line is configured to drive a sub-pixel of a display panel, and wherein:
   the signal selector comprises a plurality of switch units, and any switch unit comprises:
   a switch circuit, coupled to the input data line and an output data line, and configured to conduct in response to a write signal loaded on a control terminal of the switch circuit; and
   a boost circuit, wherein a first terminal of the boost circuit is electrically coupled to an output terminal of the switch circuit, and the boost circuit is configured to pull up a voltage of the output terminal of the switch circuit in response to a boost control signal loaded on a control terminal of the boost circuit,
   wherein the boost circuit comprises a boost capacitor, and an electrode plate of the boost capacitor is used as the first terminal of the boost circuit to be electrically coupled to the output terminal of the switch circuit; and
   the other electrode plate of the boost capacitor is used as the control terminal of the boost circuit to load the boost control signal.

2. The signal selector according to claim 1, wherein the boost circuit comprises a boost transistor, and at least one of a first terminal or a second terminal of the boost transistor is used as the first terminal of the boost circuit to be electrically coupled to the output terminal of the switch circuit; and
  a control terminal of the boost transistor is used as the control terminal of the boost circuit to load the boost control signal.

3. The signal selector according to claim 1, wherein the plurality of switch units are divided into a plurality of switch unit groups, each switch unit group comprises at least three switch units, and output data lines coupled to different switch units are respectively coupled to sub-pixels of different colors.

4. The signal selector according to claim 3, wherein the signal selector comprises a plurality of input data lines, and one input data line is coupled to one switch unit group.

5. The signal selector according to claim 1, wherein the switch circuit is a switch transistor, an input terminal of the switch circuit is a source of the switch transistor, the output terminal of the switch circuit is a drain of the switch transistor, and the control terminal of the switch circuit is a gate of the switch transistor.

6. A display panel, comprising the signal selector according to claim 1.

7. A display device, comprising a display panel, wherein the display panel comprises the signal selector according to claim 1.

8. A driving method for the signal selector according to claim 1, comprising:
  loading the write signal to the control terminal of the switch circuit in a data write period; and
  loading the boost control signal to the control terminal of the boost circuit in a pull-up period after the data write period.

9. The driving method according to claim 8, wherein the boost circuit comprises a boost transistor; and
  the driving method further comprises:
    loading a preparation voltage to a gate of the boost transistor in a preparation period before the data write period to make a Vgs of the boost transistor not less than a Vth of the boost transistor.

10. The driving method according to claim 9, wherein a lag time of a falling edge of the write signal relative to a falling edge of the boost control signal is at least greater than one pulse width of the write signal.

11. A display panel, comprising a base substrate and a driving circuit layer disposed on a side of the base substrate, wherein the driving circuit layer comprises a plurality of switch circuit areas, and each switch circuit area comprises:
  an active layer, disposed on the side of the base substrate, and comprising a first active part, a second active part, a third active part, a fourth active part and a fifth active part;
  a gate layer, disposed on a side of the active layer away from the base substrate, and comprising a first control lead, a second control lead and a first input data line arranged along a first direction, wherein an orthographic projection of the first control lead on the base substrate is overlapped with an orthographic projection of the first active part on the base substrate, and an orthographic projection of the second control lead on the base substrate is overlapped with an orthographic projection of the second active part on the base substrate; and
  a source-drain metal layer, disposed on a side of the gate layer away from the base substrate, and comprising a first signal line and a second signal line arranged along a second direction, and a first conductive structure, a second conductive structure, a third conductive structure and an output data line arranged along the first direction, wherein:
    the second signal line is coupled to the first control lead, and the first signal line is coupled to the second control lead;
    the first conductive structure is coupled to the first input data line, an orthographic projection of the first conductive structure on the base substrate is overlapped with an orthographic projection of the third active part on the base substrate, and the first conductive structure is coupled to the third active part;
    an orthographic projection of the second conductive structure on the base substrate is overlapped with an orthographic projection of the fourth active part on the base substrate, and the second conductive structure is coupled to the fourth active part;
    an orthographic projection of the third conductive structure on the base substrate is overlapped with an orthographic projection of the five active part on the base substrate, and the third conductive structure is coupled to the five active part; and
    the third conductive structure is coupled to the second conductive structure, and the second conductive structure and the third conductive structure are coupled to the output data line.

12. The display panel according to claim 11, wherein in the first direction, the orthographic projection of the second conductive structure on the base substrate is located between the orthographic projection of the first control lead on the base substrate and the orthographic projection of the second control lead on the base substrate, the orthographic projection of the second conductive structure on the base substrate is located outside the orthographic projection of the first control lead on the base substrate, and the orthographic projection of the third conductive structure on the base substrate is located outside the orthographic projection of the second control lead on the base substrate.

13. The display panel according to claim 11, wherein:
  the display panel comprises a plurality of switch circuit area groups, each switch circuit area group comprises at least three switch circuit areas, and the at least three switch circuit areas are arranged at intervals along the first direction; and
  an output data line coupled to each switch circuit area is coupled to a sub-pixel of one color, and polarities of driving terminals of two adjacent different sub-pixels are different.

14. The display panel according to claim 13, wherein:
  the first input data line comprises a first sub-input data line and a second sub-input data line, a positive total data signal is input by the first sub-input data line, and a negative total data signal is input by the second sub-input data line;
  the sub-pixel comprises a first red sub-pixel, a first green sub-pixel, a first blue sub-pixel, a second red sub-pixel, a second green sub-pixel and a second blue sub-pixel sequentially distributed along the first direction;
  the first sub-input data line and the second sub-input data line each correspond to a group of a first output data line, a second output data line and a third output data line, a first output data line corresponding to the first sub-input data line is coupled to the first red sub-pixel, a third output data line corresponding to the first sub-input data line is coupled to the first blue sub-pixel, a first output data line corresponding to the second sub-input data line is coupled to the second red sub-pixel, and a third output data line corresponding to the second sub-input data line is coupled to the second blue sub-pixel;

the display panel further comprises a third transfer line and a fourth transfer line, a second output data line corresponding to the first sub-input data line is coupled to the third transfer line, and the third transfer line is coupled to the second green sub-pixel, and a second output data line corresponding to the second sub-input data line is coupled to the fourth transfer line, and the fourth transfer line is coupled to the first green sub-pixel.

15. The display panel according to claim 11, wherein:
the plurality of switch circuit areas are divided into a plurality of switch circuit area groups, and each switch circuit area group comprises at least three switch circuit areas; and
the source-drain metal layer further comprises at least one first transfer line arranged along the first direction, one first transfer line is coupled to individual first conductive structures in one switch circuit area group, and the first input data line is coupled to the first transfer line.

16. The display panel according to claim 11, wherein:
the first signal line comprises a first sub-signal line, a third sub-signal line and a fifth sub-signal line, and the second signal line comprises a second sub-signal line, a fourth sub-signal line and a sixth sub-signal line;
the plurality of switch circuit areas are divided into a plurality of switch circuit area groups, and each switch circuit area group comprises three switch circuit areas, a second control lead of a first switch circuit area is coupled to the first sub-signal line, a second control lead of a second switch circuit area is coupled to the third sub-signal line, a second control lead of a third switch circuit area is coupled to the fifth sub-signal line, a first control lead of the first switch circuit area is coupled to the second sub-signal line, a first control lead of the second switch circuit area a is coupled to the fourth sub-signal line, and a first control lead of the third switch circuit area is coupled to the sixth sub-signal line.

17. The display panel according to claim 11, wherein:
the gate layer further comprises a second input data line, a second transfer line and a touch signal line, the second transfer line is extended along the first direction, and the second input data line and the touch signal line are extended along the second direction;
the second transfer line is coupled to the second input data line and the touch signal line; and
a touch signal on the second input data line is distributed to different touch signal lines, and the touch signal line is configured to drive a touch electrode of the display panel.

18. A display panel, comprising a base substrate and a driving circuit layer disposed on a side of the base substrate, wherein the driving circuit layer comprises a plurality of switch circuit areas, and a switch circuit area comprises:
an active layer, disposed on the side of the base substrate, and comprising a first active part, a third active part and a fourth active part;
a gate layer, disposed on a side of the active layer away from the base substrate, and comprising a first control lead, a second control lead and a first input data line, wherein an orthogonal projection of the first control lead on the base substrate is overlapped with an orthogonal projection of the first active part on the base substrate; and
a source-drain metal layer, disposed on a side of the gate layer away from the base substrate, and comprising a first signal line and a second signal line arranged along a second direction, and a first conductive structure, a second conductive structure, a third conductive structure and an output data line arranged along a first direction, wherein:
the second signal line is coupled to the first control lead, and the first signal line is coupled to the second control lead;
the first conductive structure is coupled to the first input data line, an orthographic projection of the first conductive structure on the base substrate is overlapped with an orthographic projection of the third active part on the base substrate, and the first conductive structure is coupled to the third active part;
an orthographic projection of the second conductive structure on the base substrate is overlapped with an orthographic projection of the fourth active part on the base substrate, and the second conductive structure is coupled to the fourth active part; and
an orthographic projection of the third conductive structure on the base substrate is overlapped with an orthographic projection of the second control lead on the base substrate, a storage capacitor is formed by the third conductive structure and the second control lead, the third conductive structure is coupled to the second conductive structure, and the second conductive structure and the third conductive structure are coupled to the output data line.

19. The display panel according to claim 18, wherein the second conductive structure is provided with a plurality of first through holes, the third conductive structure is provided with a plurality of second through holes, and an orthographic projection of a second through hole on the base substrate is located within an orthographic projection of a first through hole on the base substrate.

* * * * *

UNITED STATES PATENT AND TRADEMARK OFFICE
CERTIFICATE OF CORRECTION

| | | |
|---|---|---|
| PATENT NO. | : 12,405,503 B2 | Page 1 of 1 |
| APPLICATION NO. | : 18/690293 | |
| DATED | : September 2, 2025 | |
| INVENTOR(S) | : Chao Liang et al. | |

It is certified that error appears in the above-identified patent and that said Letters Patent is hereby corrected as shown below:

On the Title Page

The second Applicant(s) in item (71):
BOE TECHNOLOGY GROUP CO. LTD., Beijing (CN)
Should read:
---BOE TECHNOLOGY GROUP CO., LTD., Beijing (CN)---

Signed and Sealed this
Sixth Day of January, 2026

John A. Squires
*Director of the United States Patent and Trademark Office*